US008846451B2

(12) United States Patent
Ritchie et al.

(10) Patent No.: US 8,846,451 B2
(45) Date of Patent: Sep. 30, 2014

(54) METHODS FOR DEPOSITING METAL IN HIGH ASPECT RATIO FEATURES

(75) Inventors: Alan Ritchie, Menlo Park, CA (US); Karl Brown, San Jose, CA (US); John Pipitone, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 517 days.

(21) Appl. No.: 13/178,870

(22) Filed: Jul. 8, 2011

(65) Prior Publication Data

US 2012/0028461 A1 Feb. 2, 2012

Related U.S. Application Data

(60) Provisional application No. 61/369,240, filed on Jul. 30, 2010.

(51) Int. Cl.
*H01L 21/4763* (2006.01)
*H01L 21/44* (2006.01)
(Continued)

(52) U.S. Cl.
CPC ...... *H01L 21/76898* (2013.01); *H01L 21/2855* (2013.01); *H01J 37/3408* (2013.01); *H01L 21/76865* (2013.01); *C23C 14/34* (2013.01); *C23C 14/046* (2013.01); *C23C 16/56* (2013.01); *C23C 14/354* (2013.01); *C23C 16/503* (2013.01); *C23C 14/3492* (2013.01); *H01J 2237/3327* (2013.01); *H01L 21/76873* (2013.01); *C23C 14/345* (2013.01); *C23C 16/52* (2013.01)
USPC ........... 438/109; 438/629; 438/643; 438/653; 438/667; 438/672; 438/678; 438/687; 438/695; 438/696; 204/192.3

(58) Field of Classification Search
USPC ......... 438/109, 629, 643, 653, 667, 672, 678, 438/687, 695, 696; 257/E21.584, E21.585, 257/E21.589, E21.597
See application file for complete search history.

(56) References Cited

U.S. PATENT DOCUMENTS 6,642,146 B1 * 11/2003 Rozbicki et al. .............. 438/687
7,951,262 B2 * 5/2011 Koshiishi et al. ........ 156/345.44
(Continued)

FOREIGN PATENT DOCUMENTS

JP 2005-082873 A 3/2005
KR 10-2005-0059782 A 6/2005

OTHER PUBLICATIONS

International Search Report and Written Opinion mailed Feb. 27, 2012 for PCT Application No. PCT/US2011/044781.

(Continued)

*Primary Examiner* — Charles Garber
*Assistant Examiner* — Ron Pompey
(74) *Attorney, Agent, or Firm* — Moser Taboada; Alan Taboada

(57) ABSTRACT

Methods for depositing metal in high aspect ratio features formed on a substrate are provided herein. In some embodiments, a method includes applying first RF power at VHF frequency to target comprising metal disposed above substrate to form plasma, applying DC power to target to direct plasma towards target, sputtering metal atoms from target using plasma while maintaining pressure in PVD chamber sufficient to ionize predominant portion of metal atoms, depositing first plurality of metal atoms on bottom surface of opening and on first surface of substrate, applying second RF power to redistribute at least some of first plurality from bottom surface to lower portion of sidewalls of the opening, and depositing second plurality of metal atoms on upper portion of sidewalls by reducing amount of ionized metal atoms in PVD chamber, wherein first and second pluralities form a first layer deposited on substantially all surfaces of opening.

20 Claims, 4 Drawing Sheets

(51) Int. Cl.
*H01L 21/285* (2006.01)
*H01J 37/34* (2006.01)
*H01L 21/768* (2006.01)
*C23C 14/34* (2006.01)
*C23C 14/04* (2006.01)
*C23C 14/35* (2006.01)
*C23C 16/503* (2006.01)
*C23C 16/52* (2006.01)
*C23C 16/56* (2006.01)

(56) References Cited

U.S. PATENT DOCUMENTS 8,128,831 B2* 3/2012 Sato et al. ............... 216/41

| | | |
|---|---|---|
| 2003/0034244 A1 | 2/2003 | Yasar et al. |
| 2006/0073690 A1* | 4/2006 | Brown et al. ............... 438/597 |
| 2006/0221540 A1* | 10/2006 | Himori et al. ............... 361/234 |
| 2007/0077682 A1 | 4/2007 | Cerio, Jr. |
| 2009/0242135 A1* | 10/2009 | Koshimizu et al. ...... 156/345.48 |
| 2009/0242513 A1* | 10/2009 | Funk et al. ............... 216/67 |
| 2010/0127345 A1* | 5/2010 | Sanders et al. ............. 257/528 |
| 2011/0220494 A1* | 9/2011 | Ding ...................... 204/298.17 |

OTHER PUBLICATIONS

U.S. Appl. No. 13/223,788, filed Sep. 1, 2011, Brown et al.

* cited by examiner

METHODS FOR DEPOSITING METAL IN HIGH ASPECT RATIO FEATURES

CROSS-REFERENCE TO RELATED APPLICATIONS

This application claims benefit of U.S. provisional patent application Ser. No. 61/369,240, filed Jul. 30, 2010, which is herein incorporated by reference

FIELD

Embodiments of the present invention generally relate to methods of depositing metal in high aspect ratio features formed on a substrate.

BACKGROUND

Through-silicon via (TSV) or similar technologies require a continuous metal-containing layer to be deposited within a high aspect ratio feature on a substrate. For example, the metal-containing layer to be deposited may be a barrier layer to prevent diffusion of materials from the feature into the substrate or a seed layer which may be used as a template for filling the feature by electroplating or other suitable techniques. High aspect ratio features, for example, may include features having an aspect ratio of about 5:1 or greater. Unfortunately, the inventors have discovered that conventional direct current (DC) sputtering, such as performed in a DC physical vapor deposition (DC PVD) chamber does not provide adequate coverage to the bottom surface of a high aspect ratio feature. For example, the inventors have discovered for some metals, such as titanium (Ti), tantalum (Ta), or copper (Cu), the bottom surface coverage can be less than about 3%. The lack of continuous surface coverage in the feature can result in void formation during the filling of the feature. Further, while DC PVD process conditions can be modified to achieve acceptable bottom surface coverage, the conditions require long deposition times as well as exposing the substrate to elevated temperatures, which significantly impact the cost per substrate and undesirably expose the substrate to elevated temperatures causing undesirable diffusion of materials between existing regions of the substrate.

Accordingly, the inventors have developed improved techniques to deposit continuous metal-containing layers in high aspect ratio features.

SUMMARY

Methods for depositing metal in high aspect ratio features formed on a substrate are provided herein. In some embodiments, a method of processing a substrate in a physical vapor deposition (PVD) chamber, the substrate having an opening formed in a first surface of the substrate and extending into the substrate towards an opposing second surface of the substrate, the opening having an aspect ratio of height to width of at least 5:1 is provided. In some embodiments, the method may include applying a first RF power at a VHF frequency to a target comprising a metal disposed above the substrate to form a plasma from a plasma-forming gas; applying DC power to the target to direct the plasma towards the target; sputtering metal atoms from the target using the plasma while maintaining a first pressure in the PVD chamber sufficient to ionize a predominant portion of the metal atoms sputtered from the target; depositing a first plurality of metal atoms on a bottom surface of the opening and on the first surface of the substrate; applying a second RF power to a first electrode disposed beneath the substrate to redistribute at least some of the first plurality of metal atoms from the bottom surface to a lower portion of a sidewall of the opening; and depositing a second plurality of metal atoms on an upper portion of the sidewall by reducing an amount of ionized metal atoms in the PVD chamber, wherein the first and second pluralities of metal atoms form a first layer deposited on substantially all surfaces of the opening.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
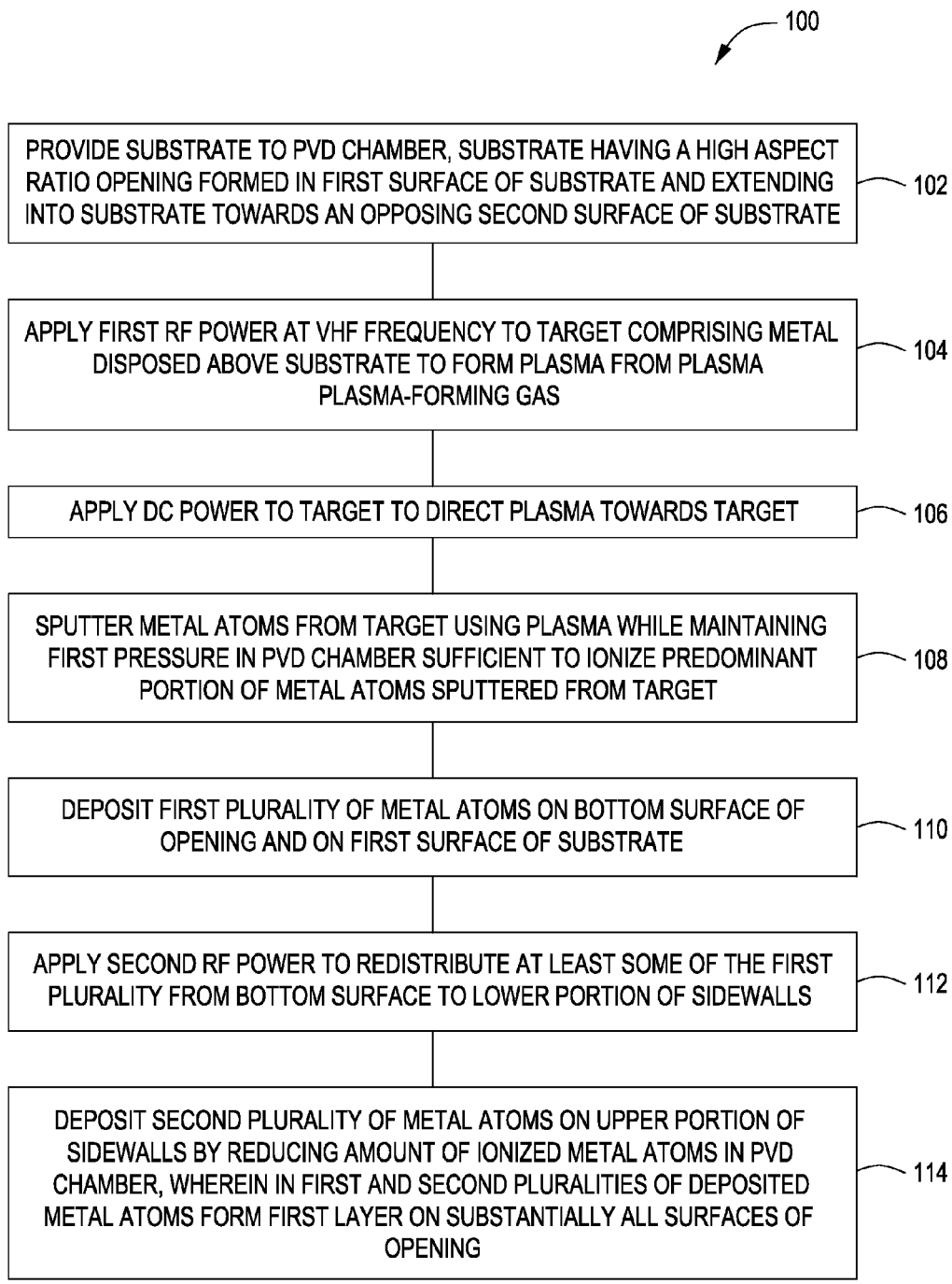
FIG. 1 depicts a flow chart of a method for processing a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for depositing metals in high aspect ratio features formed on substrates are provided herein. The inventive methods advantageously provide continuous coverage of surfaces of the high aspect ratio feature with metal while maintaining high process throughput and low substrate temperature. The inventive methods may be utilized with through silicon via (TSV) applications, for example, for either via first or via last methods of fabrication, as well as other suitable applications where depositing a continuous metal layer in high aspect ratio openings may be desired.

FIG. 1 depicts a flow chart of a method 100 for processing a substrate in accordance with some embodiments of the present invention. The method 100 is described below with respect to the stages of filling a high aspect ratio feature as depicted in FIG. 2. Further, the method 100 may be performed in any suitable PVD process chamber having both DC and radio frequency (RF) power sources, such as a process chamber 300 described below and depicted in FIG. 3.

The method 100 begins at 102 by providing a substrate 200 to a PVD chamber, for example process chamber 300. The substrate 200 includes a high aspect ratio opening 202 formed in a first surface 204 of the substrate 200 and extending into the substrate 200 towards an opposing second surface 206 of the substrate 200. The substrate 200 may be any suitable substrate having a high aspect ratio opening formed therein. For example, the substrate 200 may comprise one or more of silicon (Si), silicon oxide (SiO$_2$), or the like. In addition, the substrate 200 may include additional layers of materials or may have one or more completed or partially completed structures formed therein or thereon.

The opening may be any opening having a high aspect ratio, such as a via, trench, dual damascene structure, or the like. In some embodiments, the opening 202 may have a height to width aspect ratio of at least about 5:1 (e.g., a high aspect ratio). For example, in some embodiments, the aspect ratio may be about 10:1 or greater, such as about 15:1. The opening 202 may be formed by etching the substrate using any suitable etch process. The opening 202 includes a bottom surface 208 and sidewalls 210 as shown.

In some embodiments, the bottom surface 208 and the sidewalls 210 may be covered with one or more layers prior to depositing metal atoms as described below. For example, and as shown by dotted lines in FIG. 2A, the bottom surface and sidewalls of the opening 202 and the first surface of the substrate 200 may be covered by an oxide layer 212, such as silicon oxide ($SiO_2$) or the like. The oxide layer may be deposited or grown, for example in a chemical vapor deposition (CVD) chamber or in a oxidation chamber, prior to providing the substrate 200 to a PVD chamber. The oxide layer 212 may serve as an electrical and/or physical barrier between the substrate and a metal-containing layer to be subsequently deposited in the opening, and/or may function as a better surface for attachment during the deposition process discussed below than a native surface of the substrate.

In some embodiments, a barrier layer 214 may be deposited atop the oxide layer 212 (as shown), or atop the bottom surface and sidewalls of the opening and the first surface of the substrate if an oxide layer is not present. The barrier layer 214 may serve a similar purpose as the oxide layer 212 discussed above. In some embodiments, the barrier layer 214 may include at least one of titanium (Ti), tantalum (Ta), cobalt (Co), oxides or nitrides of Ti, Ta, and/or Co, or the like. The barrier layer 214 may be deposited by any suitable methods, such as by CVD or PVD, including by using the method 100 described below to form a continuous barrier layer in the opening 202.

Figure 2A:
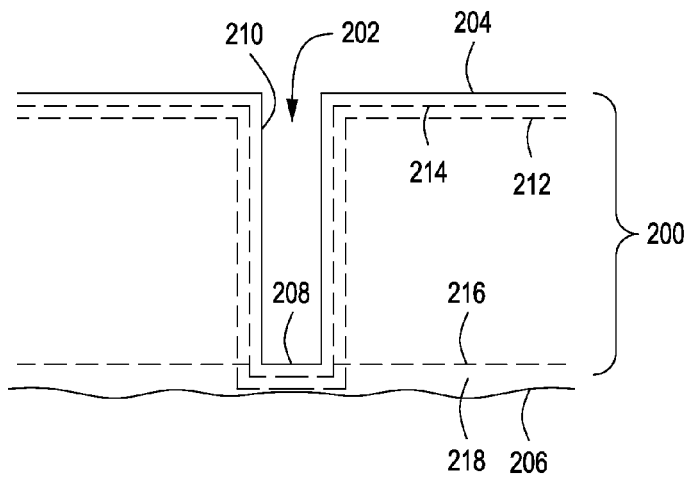
FIGS. 2A-F depicts the stages of filling a high aspect ratio opening in accordance with some embodiments of the present invention.

In some embodiments, and as illustrated in phantom in FIG. 2A, the opening 202 may extend completely through the substrate 200 and an upper surface 216 of a second substrate 218 may form the bottom surface 208 of the opening 202. The second substrate 218 may be disposed adjacent to the second surface 206 of the substrate 200. Further (as shown in FIG. 2F and discussed below), a device, such as a logic device or the like, or a portion of a device requiring electrical connectivity, such as a gate, a contact pad, a conductive via, or the like, may be disposed in the upper surface 216 of the second substrate 218 and aligned with the opening 202.

At 104, a first RF power (such as from an RF power source 318, described below) is applied at a VHF frequency to a target comprising a metal disposed above the substrate 200 to form a plasma from a plasma-forming gas. For example, the target may be the target 306 discussed below. The target may comprise one or more of metals, metal alloys, or the like, of suitable purity to form a continuous barrier layer or seed layer of a desired material on the surfaces of the opening 202 and the first surface 204 of the substrate 200. For example, the target may comprise titanium (Ti), tantalum (Ta), copper (Cu), aluminum (Al), cobalt (Co), tungsten (W), alloys thereof, or the like. The plasma-forming gas may include argon (Ar), neon (Ne), krypton (Kr), helium (He), hydrogen ($H_2$), nitrogen ($N_2$) or the like, or combinations thereof.

The first RF power may be applied at a VHF frequency for one or more of forming the plasma from the plasma-forming gas and ionizing metal atoms sputtered from the target by the plasma. As used herein, a VHF frequency is a frequency in the range of from about 27 MHz to about 162 MHz. In some embodiments, the VHF frequency applied is about 60 MHz. Increasing the VHF frequency may increase the plasma density and/or the amount of ionization in metal atoms sputtered from the target.

At 106, DC power is applied to the target, for example, from a DC power source 320 coupled to the target 306, as described below with respect to FIG. 3. The DC power may bias the target to facilitate directing the plasma towards the target. The DC power may range in magnitude from about 1 to about 4 kilowatts (kW). In some embodiments, the DC power may be about 2 kW. The DC power may be adjusted to control the deposition rate of sputtered metal atoms on the substrate. For example, increasing the DC power can result in increased interaction of the plasma with the target and increased sputtering of metal atoms from the target.

At 108, metal atoms are sputtered from the target using the plasma while maintaining a first pressure in the PVD chamber sufficient to ionize a predominant portion of metal atoms being sputtered from the target. For example, a predominant portion of metal atoms may range from about 50 to about 75 percent of the total number of metal atoms arriving at the wafer. In some embodiments, and for example, metal atoms initially sputtered from the target may be mostly non-ionized, only once they have passed through the plasma will metal atoms become ionized. For example, a majority of neutral metal atoms will be lost to shields of the process chamber, so metal atoms arriving at the wafer should be predominantly ionized. The first pressure, in addition to the first RF power and the DC power applied, may be dependent on process chamber geometry (such as substrate size, target to substrate distance, and the like). For example, the first pressure may range from about 60 to about 300 millitorr (mT) in a chamber configured with a target to substrate gap of about 60 millimeters (mm). In some embodiments, the first pressure is about 100 mT. The first pressure in the chamber may be maintained by the flow rate of the plasma-forming gas and/or the flow rate of an additional gas, such as an inert gas, which may be co-flowed with the plasma-forming gas. The first pressure may provide a high density of gas molecules between the target and the substrate with which sputtered metal atoms may collide and be ionized. Pressure may be additionally utilized to control the amount of ionization of metal atoms sputtered from the target. For example, increasing pressure in the chamber and/or increasing the target to substrate gap may increase the number of collisions with metal atoms and thus increase the amount of ionized metal atoms.

Figure 2B:
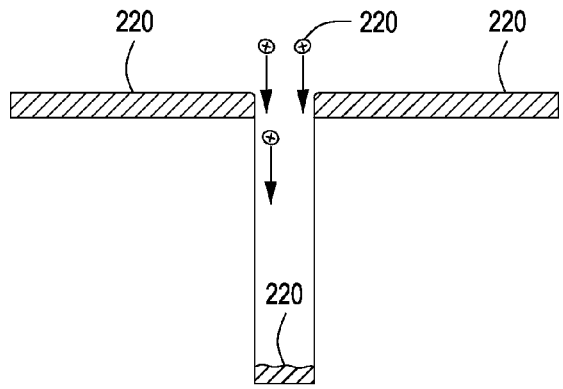

At 110, a first plurality of metal atoms 220 are deposited on the upper surface 204 of the substrate 200 and on the bottom surface 208 of the opening 202, as illustrated in FIG. 2B. The first plurality of metal atoms 220 may be deposited using the processing conditions discussed above, such as the first pressure, first RF power, DC power, and/or the VHF frequency. Such processing conditions can facilitate the direction of the first plurality of metal atoms 220 approximately perpendicular to substrate 200 as illustrated in FIG. 2B. In some embodiments, an optional third RF power may be applied to the substrate 200 during the deposition of the first plurality of metal atoms 220. The third RF power may be applied at a frequency ranging from about 400 kHz to about 27 MHz and at a power of up to about 50 W. In some embodiments, the frequency of the third RF power may be about 2 MHz, or about 13.56 MHz, or both if an optional second RF power source is additionally coupled a substrate support pedestal of the PVD chamber. The optional third RF power may be small to minimize energy of the depositing metal atoms such as to minimize any overhang formation over a mouth of the opening 202.

Alternatively, another optional embodiment for achieving a similar result as applying optional third RF power, is to use a tuning circuit which may be attached to the substrate support. The tuning circuit (LC) can be used to vary the impedance of an existing substrate support tuning circuit, which couples an RF bias source to the substrate support, to accept or reject current from the plasma. The arrival energy of ionized species can be tailored by varying the reactance, to achieve a low energy or high energy process, which equates to low or high bias power.

Figure 2C:
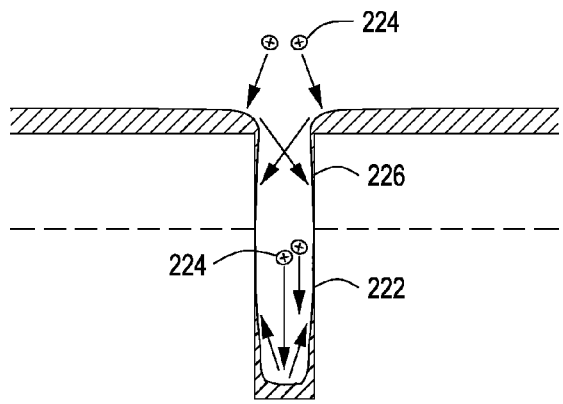

At 112, a second RF power is applied to redistribute at least some of the first plurality of metal atoms 220 from the bottom surface 208 of the opening 202 to a lower portion 222 of the sidewalls 210 of the opening 202, as illustrated in FIG. 2C. The lower portion 222 may include about the lower 50 percent of the sidewalls 210 of the opening 202. The second RF power may be applied at the same frequencies discussed above at 110. The second RF power may be utilized to increase ion energy and/or angle of incidence of ions 224 incident on the substrate 200 as shown in FIG. 2C. For example, the ions incident on the substrate 200 may include ionized metal atoms, ionized elements from the plasma, or a combination thereof. The second RF power may be increased to increase ion energy, for example, to increase the impact of ions on the deposited metal atoms on the bottom surface 208 of the opening 202, as illustrated in FIG. 2B. The increased impact of ions on the bottom surface 208 of the opening can facilitate redistribution of at least some of the first plurality of metal atoms 220 of metal atoms onto the lower portion 222 as shown. A magnitude of the second RF power may be substantially greater than that of the optional third RF power applied during the deposition of the first plurality of metal atoms 220 as discussed above. For example, a magnitude of the second RF power may be greater than about 50 Watts, or range from about 100 to about 400 watts. In some embodiments, the magnitude of the second RF power is about 200 watts.

In some embodiments, as illustrated in FIG. 2C, at least some of the first plurality of metal atoms 220 may be redistributed from the upper surface 204 of the substrate 200 into the opening 202. For example, as shown in FIG. 2C, due to the non-perpendicular angle of incidence of the incident ions 224 with respect to the substrate 200 due at least in part to the applied second RF power, at least some of the first plurality of metal atoms 220 may be redistributed from the upper surface 204 to an upper portion 226 of the sidewalls 210 of the opening 202.

Further, in some embodiments, the DC power is maintained to continue to sputter metal atoms from the target using the plasma while redistributing at least some of the first plurality of metal atoms 220 to the lower portion 222 at 112. Alternatively or in combination, at least one of the first RF power or the first pressure may be maintained to continue deposition of the first plurality of metal atoms 220 while redistributing at least some of the first plurality of metal atoms 220 at 112. In some embodiments, the first pressure is reduced to a second pressure to reduce the amount of ionized metal atoms incident on the substrate 200. The second pressure may range from about 40 to about 80 mTorr.

Alternatively, the deposition of the first plurality of metal atoms 220 may be substantially reduced or may cease during redistribution at 112. For example, and in some embodiments, the DC power applied to the target may be reduced or turned off during redistribution to prevent sputtering of metal atoms from the target. Such embodiments may be utilized to reduce the thickness a layer of deposited metal atoms on the upper surface 204 or the bottom surface 208 during redistribution. Accordingly, in this alternative embodiment, the ions 224 incident on the substrate 200 may substantially comprise ionized elements of the plasma-forming gas.

Figure 2D:
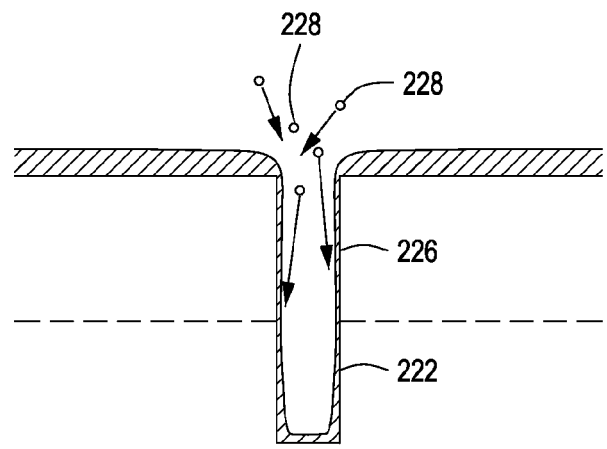
Figure 2E:
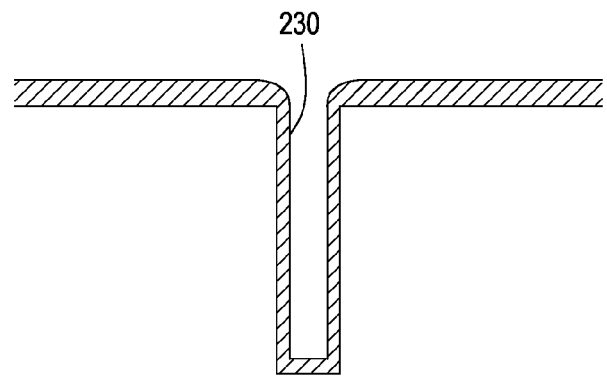
Figure 2F:
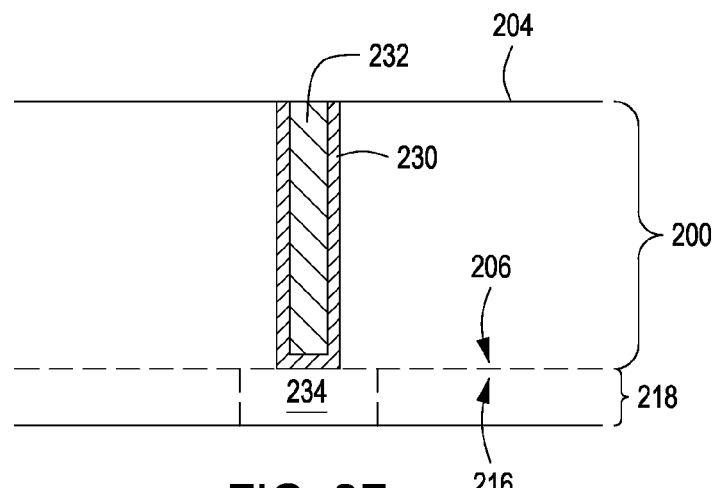

At 114, a second plurality of metal atoms 228 is deposited on the upper portion 226 of the sidewalls 210 by reducing the amount of ionized metal atoms in the PVD chamber (shown in FIG. 2D), wherein the first and second pluralities of metal atoms 220, 228 together form a first layer 230 deposited on substantially all surfaces of the opening 202 (shown in FIG. 2E). The upper portion 226 may include about the upper 50 percent of the sidewalls 210 of the opening 202. The deposition of the second plurality of metal atoms 228 may include one or more of reducing the first RF power, the first pressure, or increasing the DC power to achieve depositing of the second plurality of metal atoms 228 on the upper portion 226 of the sidewalls 210. For example, and in some embodiments, the first pressure may be reduced to a third pressure, or alternatively, the second pressure may be reduced to the third pressure, if the first pressure has already been reduced as discussed above. In some embodiments, the third pressure may range from about 10 to about 40 mTorr. For example, the third pressure may be sufficient to decrease the amount of ionized metal atoms, which in term increases the amount of neutral metal atoms in the second plurality of metal atoms 228 incident on the substrate 200. The neutral metal atoms, which have no charge, may not be subject to external applied forces, such as from the plasma, substrate RF bias, or the like. Accordingly, at least some of the neutral metal atoms may be incident at non-perpendicular angles to the substrate 200 and deposit on the upper portion 226, as illustrated in FIG. 2D.

Alternatively, or in combination with reducing pressure in the PVD chamber during deposition of the second plurality of metal atoms 228, the first RF power may be reduced from a first magnitude to a second magnitude to reduce at least one of the amount of ionized metal atoms in the PVD chamber or the amount of sputtered metal atoms in the PVD chamber. In some embodiments, the second magnitude may range from about 1 kW to about 3 kW.

Alternatively, or in combination with any of the above embodiments for depositing the second plurality of metal atoms 228, the DC power may be reduced from a first magnitude to a second magnitude to reduce the amount of ionized metal atoms in the PVD chamber by reducing the amount of sputtered metal atoms in the PVD chamber. In some embodiments, the second magnitude may range from about 0.5 to about 2 kW.

Alternatively, or in combination with any of the above embodiments for depositing the second plurality of metal atoms 228, the second RF power may be reduced from a first magnitude to a second magnitude or to a magnitude of zero, to reduce or prevent ionized species, such as ionized elements of the plasma-forming gas, from removing deposited metal atoms from the upper portion 226 of the opening 202. In some embodiments, the second magnitude of the second RF power may be about less than 50 W.

After the first layer 230 is formed at 114, the method 100 may proceed by depositing a material 232 atop the first layer 230 to fill the opening 202 by electroplating or a similar processing technique, as depicted in FIG. 2F. The first layer 230 may function as a seed layer upon which the material 232 is deposited. The material 232 may include metals, metal alloys, or the like. In some embodiments, the material comprises one or more of copper (Cu), tungsten (W), or the like. In some embodiments, the material 232 and the metal of the first layer 230 are the same material.

In some embodiments, and as discussed above with respect to FIG. 2A, the second substrate 218 may have been provided prior to performing the methods steps 104-114 described above. Accordingly, as illustrated in FIG. 2F, the second substrate 218 is disposed adjacent to the second surface 206 of the substrate 200, where the opening 202 extends completely through the substrate 200 and the upper surface 216 of the second substrate 218 forms the bottom surface of the opening 202. In some embodiments, a device 234 may be disposed in the upper surface 216 of the second substrate and aligned with the opening 202. The first surface 204 of the substrate 200 may be further processed to remove excess material 232 from the fill process, deposited metal atoms, portions of other layers that may be present (such as the oxide layer 212 and/or the barrier layer 214). For example, chemical mechanical polishing, lapping, etching, or the like may be used to remove the undesired materials and exposing the first surface 204, as illustrated in FIG. 2F.

Alternatively, in some embodiments, the second substrate 218 may not have been provided prior to performing method steps 104-114. In such embodiments, and after the material 232 has been deposited as described above, the method may proceed by removing material from the second surface 206 of the substrate 200 to remove the bottom surface 208 of the opening 202 and expose at least one the first layer 230 or the deposited material 232 (the first layer 230 is illustrated as being exposed in FIG. 2F). For example, material may be removed from the second surface 206 of the substrate 200, for example, by chemical mechanical polishing, lapping, or the like, to expose at least one of the first layer 230 or the deposited material 232.

After the removal of material from the second surface 206, the second surface 206 of the substrate 200 may be coupled to the upper surface 216 of the second substrate 218. In embodiments where the device 234 is disposed in the upper surface 216 of the second substrate 218, the device 234 may be aligned with the opening 202 in the substrate 200.

Figure 3:
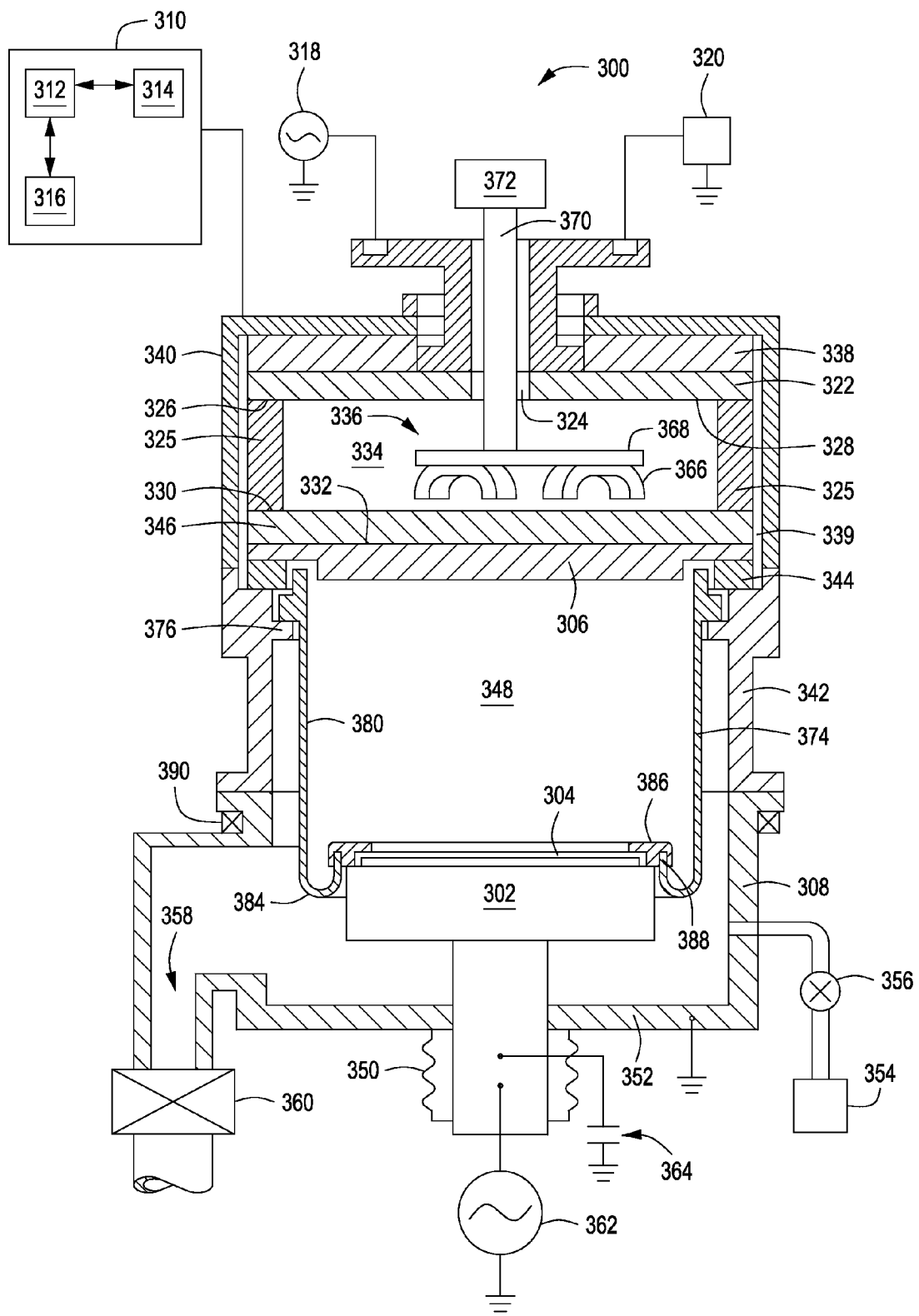
FIG. 3 depicts a schematic, cross-sectional view of a physical vapor deposition (PVD) chamber in accordance with some embodiments of the present invention.

FIG. 3 depicts a schematic, cross-sectional view of a physical vapor deposition chamber (process chamber 300) in accordance with some embodiments of the present invention. Examples of suitable PVD chambers include the ALPS® Plus and SIP ENCORE® PVD process chambers, both commercially available from Applied Materials, Inc., of Santa Clara, Calif. Other process chambers from Applied Materials, Inc. or other manufactures may also benefit from the inventive apparatus disclosed herein.

The process chamber 300 contains a substrate support pedestal 302 for receiving a substrate 304 thereon, and a sputtering source, such as a target 306. The substrate support pedestal 302 may be located within a grounded enclosure, which may be a chamber wall 308 (as shown) or a grounded shield (a ground shield 340 is shown covering at least some portions of the chamber 300 above the target 306. In some embodiments, the ground shield 340 could be extended below the target to enclose the pedestal 302 as well.).

In some embodiments, the process chamber includes a feed structure for coupling RF and DC energy to the target 306. The feed structure is an apparatus for coupling RF and DC energy to the target, or to an assembly containing the target, for example, as described herein. A first end of the feed structure can be coupled to an RF power source 318 and a DC power source 320, which can be respectively utilized to provide RF and DC energy to the target 306. For example, the DC power source 320 may be utilized to apply a negative voltage, or bias, to the target 306. In some embodiments, RF energy supplied by the RF power source 318 may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies. The feed structure may be fabricated from suitable conductive materials to conduct the RF and DC energy from the RF power source 318 and the DC power source 320.

In some embodiments, the feed structure may have a suitable length that facilitates substantially uniform distribution of the respective RF and DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RF energy is more uniformly distributed about the feed structure to approximate RF coupling to the true center point of the feed structure. The inner diameter of the feed structure may be as small as possible, for example, from about 1 inch to about 6 inches, or about 4 inches in diameter. Providing a smaller inner diameter facilitates improving the length to ID ratio without increasing the length of the feed structure.

The second end of the feed structure may be coupled to a source distribution plate 322. The source distribution plate includes a hole 324 disposed through the source distribution plate 322 and aligned with a central opening of the feed structure. The source distribution plate 322 may be fabricated from suitable conductive materials to conduct the RF and DC energy from the feed structure.

The source distribution plate 322 may be coupled to the target 306 via a conductive member 325. The conductive member 325 may be a tubular member having a first end 326 coupled to a target-facing surface 328 of the source distribution plate 322 proximate the peripheral edge of the source distribution plate 322. The conductive member 325 further includes a second end 330 coupled to a source distribution plate-facing surface 332 of the target 306 (or to the backing plate 346 of the target 306) proximate the peripheral edge of the target 306.

A cavity 334 may be defined by the inner-facing walls of the conductive member 325, the target-facing surface 328 of the source distribution plate 322 and the source distribution plate-facing surface 332 of the target 306. The cavity 334 is fluidly coupled to the central opening 315 of the body via the hole 324 of the source distribution plate 322. The cavity 334 and the central opening 315 of the body may be utilized to at least partially house one or more portions of a rotatable magnetron assembly 336 as illustrated in FIG. 3 and described further below. In some embodiments, the cavity may be at least partially filled with a cooling fluid, such as water ($H_2O$) or the like.

A ground shield 340 may be provided to cover the outside surfaces of the lid of the process chamber 300. The ground shield 340 may be coupled to ground, for example, via the ground connection of the chamber body. The ground shield 340 has a central opening to allow the feed structure to pass through the ground shield 340 to be coupled to the source distribution plate 322. The ground shield 340 may comprise any suitable conductive material, such as aluminum, copper, or the like. An insulative gap 339 is provided between the ground shield 340 and the outer surfaces of the distribution plate 322, the conductive member 325, and the target 306 (and/or backing plate 346) to prevent the RF and DC energy from being routed directly to ground. The insulative gap may be filled with air or some other suitable dielectric material, such as a ceramic, a plastic, or the like.

In some embodiments, a ground collar may be disposed about the body and lower portion of the feed structure. The ground collar is coupled to the ground shield 340 and may be an integral part of the ground shield 340 or a separate part coupled to the ground shield to provide grounding of the feed structure. The ground collar may be made from a suitable conductive material, such as aluminum or copper. In some embodiments, a gap disposed between the inner diameter of the ground collar and the outer diameter of the body of the feed structure may be kept to a minimum and be just enough to provide electrical isolation. The gap can be filled with isolating material like plastic or ceramic or can be an air gap. The ground collar prevents cross-talk between the RF feed (e.g., electrical feed 205, discussed below) and the body, thereby improving plasma, and processing, uniformity.

An isolator plate 338 may be disposed between the source distribution plate 322 and the ground shield 340 to prevent the RF and DC energy from being routed directly to ground. The isolator plate 338 has a central opening to allow the feed structure to pass through the isolator plate 338 and be coupled to the source distribution plate 322. The isolator plate 338 may comprise a suitable dielectric material, such as a ceramic, a plastic, or the like. Alternatively, an air gap may be provided in place of the isolator plate 338. In embodiments where an air gap is provided in place of the isolator plate, the ground shield 340 may be structurally sound enough to support any components resting upon the ground shield 340.

The target 306 may be supported on a grounded conductive aluminum adapter 342 through a dielectric isolator 344. The target 306 comprises a material to be deposited on the substrate 304 during sputtering, such a metal or metal oxide. In some embodiments, the backing plate 346 may be coupled to the source distribution plate-facing surface 332 of the target 306. The backing plate 346 may comprise a conductive material, such as copper-zinc, copper-chrome, or the same material as the target, such that RF and DC power can be coupled to the target 306 via the backing plate 346. Alternatively, the backing plate 346 may be non-conductive and may include conductive elements (not shown) such as electrical feedthroughs or the like for coupling the source distribution plate-facing surface 332 of the target 306 to the second end 330 of the conductive member 325. The backing plate 346 may be included for example, to improve structural stability of the target 306.

The substrate support pedestal 302 has a material-receiving surface facing the principal surface of the target 306 and supports the substrate 304 to be sputter coated in planar position opposite to the principal surface of the target 306. The substrate support pedestal 302 may support the substrate 304 in a central region 348 of the process chamber 300. The central region 348 is defined as the region above the substrate support pedestal 302 during processing (for example, between the target 306 and the substrate support pedestal 302 when in a processing position).

In some embodiments, the substrate support pedestal 302 may be vertically movable through a bellows 350 connected to a bottom chamber wall 352 to allow the substrate 304 to be transferred onto the substrate support pedestal 302 through a load lock valve (not shown) in the lower portion of processing the chamber 300 and thereafter raised to a deposition, or processing position. One or more processing gases may be supplied from a gas source 354 through a mass flow controller 356 into the lower part of the chamber 300. An exhaust port 358 may be provided and coupled to a pump (not shown) via a valve 360 for exhausting the interior of the process chamber 300 and facilitating maintaining a desired pressure inside the process chamber 300.

An RF bias power source 362 may be coupled to the substrate support pedestal 302 in order to induce a negative DC bias on the substrate 304. In addition, in some embodiments, a negative DC self-bias may form on the substrate 304 during processing. For example, RF power supplied by the RF bias power source 362 may range in frequency from about 2 MHz to about 60 MHz, for example, non-limiting frequencies such as 2 MHz, 13.56 MHz, or 60 MHz can be used. Optionally, a second RF bias power source (not shown) may be coupled to the substrate support pedestal 302 and provide any of the frequencies discussed above for use with the RF bias power source 362. In other applications, the substrate support pedestal 302 may be grounded or left electrically floating. For example, a capacitance tuner 364 may be coupled to the substrate support pedestal for adjusting voltage on the substrate 304 for applications where RF bias power may not be desired.

A rotatable magnetron assembly 336 may be positioned proximate a back surface (e.g., source distribution plate-facing surface 332) of the target 306. The rotatable magnetron assembly 336 includes a plurality of magnets 366 supported by a base plate 368. The base plate 368 connects to a rotation shaft 370 coincident with the central axis of the chamber 300 and the substrate 304. A motor 372 can be coupled to the upper end of the rotation shaft 370 to drive rotation of the magnetron assembly 336. The magnets 366 produce a magnetic field within the chamber 300, generally parallel and close to the surface of the target 306 to trap electrons and increase the local plasma density, which in turn increases the sputtering rate. The magnets 366 produce an electromagnetic field around the top of the chamber 300, and magnets 366 are rotated to rotate the electromagnetic field which influences the plasma density of the process to more uniformly sputter the target 306. For example, the rotation shaft 370 may make about 0 to about 150 rotations per minute.

In some embodiments, the chamber 300 may further include a process kit shield 374 having an internal surface 380 facing the central region 348. The process kit shield 374 may be connected to a ledge 376 of the adapter 342. The adapter 342 in turn is sealed and grounded to the chamber wall 308, which may be aluminum. Generally, the process kit shield 374 extends downwardly along the walls of the adapter 342 and the chamber wall 308 downwardly to below an upper surface of the substrate support pedestal 302 and returns upwardly until reaching an upper surface of the substrate support pedestal 302 (e.g., forming a u-shaped portion 384 at the bottom). Alternatively, the bottommost portion of the process kit shield need not be a u-shaped portion 384 and may have any suitable shape. A cover ring 386 rests on the top of an upwardly extending lip 388 of the process kit shield 374 when the substrate support pedestal 302 is in its lower, loading position but rests on the outer periphery of the substrate support pedestal 302 when it is in its upper, deposition position to protect the substrate support pedestal 302 from sputter deposition. An additional deposition ring (not shown) may be used to shield the periphery of the substrate 304 from deposition. Embodiments of a process kit shield are discussed below in accordance with the present invention.

In some embodiments, a magnet 390 may be disposed about the chamber 300 for selectively providing a magnetic field between the substrate support pedestal 302 and the target 306. For example, as shown in FIG. 3, the magnet 390 may be disposed about the outside of the chamber wall 308 in a region just above the substrate support pedestal 302 when in processing position. In some embodiments, the magnet 390 may be disposed additionally or alternatively in other locations, such as adjacent the adapter 342. The magnet 390 may be an electromagnet and may be coupled to a power source (not shown) for controlling the magnitude of the magnetic field generated by the electromagnet.

A controller 310 may be provided and coupled to various components of the process chamber 300 to control the operation thereof. The controller 310 includes a central processing unit (CPU) 312, a memory 314, and support circuits 316. The controller 310 may control the process chamber 300 directly, or via computers (or controllers) associated with particular process chamber and/or support system components. The controller 310 may be one of any form of general-purpose computer processor that can be used in an industrial setting for controlling various chambers and sub-processors. The memory 314, or computer readable medium, of the controller 310 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 316 are coupled to the CPU 312 for supporting the processor in a conventional manner. These circuits include cache, power supplies, clock circuits, input/output circuitry and subsystems, and the like. Inventive methods as described herein may be stored in the memory 314 as software routine that may be executed or invoked to control the operation of the process chamber 300 in the manner described herein. The software routine may also be stored and/or executed by a second CPU (not shown) that is remotely located from the hardware being controlled by the CPU 312.

Thus, methods for depositing metals in high aspect ratio features formed on substrates have been provided herein. The inventive methods advantageously provide continuous coverage of surfaces of the high aspect ratio feature with metal while maintaining high process throughput and low substrate temperature. The inventive methods may be utilized with through silicon via (TSV) applications, for example, for either via first or via last methods of fabrication, as well as other suitable applications where depositing a continuous metal layer may be advantageous.

While the foregoing is directed to embodiments of the present invention, other and further embodiments of the invention may be devised without departing from the basic scope thereof.

The invention claimed is:

1. A method of processing a substrate in a physical vapor deposition (PVD) chamber, the substrate having an opening formed in a first surface of the substrate and extending into the substrate towards an opposing second surface of the substrate, the opening having an aspect ratio of height to width of at least 5:1, the method comprising:
applying a first RF power at a VHF frequency to a target comprising a metal disposed above the substrate to form a plasma from a plasma-forming gas;
applying DC power to the target to direct the plasma towards the target;
sputtering metal atoms from the target using the plasma while maintaining a first pressure in the PVD chamber sufficient to ionize a predominant portion of the metal atoms sputtered from the target;
depositing a first plurality of metal atoms on a bottom surface of the opening and on the first surface of the substrate;
applying a second RF power to a first electrode disposed beneath the substrate to redistribute at least some of the first plurality of metal atoms from the bottom surface to a lower portion of a sidewall of the opening; and
depositing a second plurality of metal atoms on an upper portion of the sidewall by reducing an amount of ionized metal atoms in the PVD chamber, wherein the first and second pluralities of metal atoms form a first layer deposited on substantially all surfaces of the opening.

2. The method of claim 1, wherein depositing the first plurality of metal atoms further comprises:
applying a third RF power having a magnitude of up to about 50 watts to the first electrode to direct the first plurality of metal atoms towards the bottom surface of the opening.

3. The method of claim 2, wherein the third RF power has a magnitude that is less than that of the second RF power.

4. The method of claim 1, wherein at least some of the first plurality of metal atoms are redistributed from the upper surface of the substrate into the opening.

5. The method of claim 1, wherein applying the second RF power to the first electrode to redistribute at least some of the first plurality of metal atoms further comprises:
maintaining the magnitude of the DC power to continue to sputter metal atoms from the target using the plasma while redistributing at least some of the first plurality of metal atoms to the lower portion.

6. The method of claim 1, wherein applying the second RF power to the first electrode to redistribute at least some of the first plurality of metal atoms further comprises:
reducing the magnitude of or turning off the DC power to prevent sputtering of metal atoms from the target using the plasma while redistributing at least some of the first plurality to the lower portion.

7. The method of claim 1, wherein applying the second RF power to the first electrode to redistribute at least some of the first plurality of metal atoms further comprises:
maintaining at least one of the first RF power or the first pressure to continue deposition of the first plurality on the first surface of the substrate and the bottom surface of the opening while redistributing at least some of the first plurality to the lower portion of the sidewalls of the opening.

8. The method of claim 1, wherein applying the second RF power to redistribute at least some of the first plurality of metal atoms further comprises:
reducing the first pressure to a second pressure.

9. The method of claim 8, wherein depositing the second plurality of metal atoms on the upper portion of the sidewalls further comprises:
reducing the second pressure to a third pressure to reduce the amount of ionized metal atoms in the PVD chamber.

10. The method of claim 1, wherein depositing the second plurality of metal atoms on the upper portion of the sidewalls of the opening further comprises:
reducing the magnitude of the first RF power from a first magnitude to a second magnitude to reduce the amount of ionized metal atoms in the PVD chamber.

11. The method of claim 1, wherein depositing the second plurality of metal atoms on the upper portion of the sidewalls of the opening further comprises:
reducing the magnitude of the DC power from a first magnitude to a second magnitude to reduce the amount of ionized metal atoms in the PVD chamber.

12. The method of claim 1, wherein depositing the second plurality of metal atoms on the upper portion of the sidewalls of the opening further comprises:
reducing the magnitude of the second RF power to less than about 50 Watts.

13. The method of claim 1, further comprising:
    etching the substrate to form the opening in the substrate; and
    forming an oxide layer on the upper surface of the substrate and along the sidewalls and the bottom surface of the opening; and
    forming a barrier layer atop the oxide layer prior to depositing metal atoms.

14. The method of claim 11, further comprising:
    depositing a material atop the first layer to fill the opening by an electroplating process.

15. The method of claim 14, wherein the deposited material and the metal are the same material.

16. The method of claim 14, wherein the substrate is a first substrate and further comprising:
    providing a second substrate disposed adjacent to the second surface of the first substrate, wherein the opening extends completely through the first substrate and an upper surface of the second substrate forms the bottom of the opening.

17. The method of claim 14, further comprising:
    removing the bottom surface of the opening to expose at least one of the first layer or the deposited material.

18. The method of claim 17, wherein removing the bottom surface of the opening further comprises:
    at least partially removing the second surface of the substrate by chemical mechanical polishing to remove the bottom surface of the opening.

19. The method of claim 18, further comprising:
    coupling the second surface of the substrate to an upper surface of a second substrate.

20. The method of claim 19, wherein coupling the second surface of the substrate further comprises:
    aligning the opening with a corresponding device disposed in the upper surface of the second substrate.

* * * * *